United States Patent [19]

Woodruff et al.

[11] Patent Number: 5,037,781
[45] Date of Patent: Aug. 6, 1991

[54] MULTI-LAYERED FIELD OXIDE STRUCTURE

[75] Inventors: Richard L. Woodruff; John T. Chaffee; Craig Hafer, all of Colorado Springs, Colo.

[73] Assignee: United Technologies Corporation, Hartford, Conn.

[21] Appl. No.: 220,764

[22] Filed: Jul. 5, 1988

[51] Int. Cl.$^5$ .............................. H01L 21/00
[52] U.S. Cl. .................. 437/228; 156/901; 428/901; 437/241; 437/243; 437/245
[58] Field of Search ................ 428/901; 156/901; 29/569.1; 437/228, 241, 243, 245

[56] References Cited

U.S. PATENT DOCUMENTS

| | | | |
|---|---|---|---|
| 4,673,531 | 6/1987 | Lee | 428/901 |
| 4,681,795 | 7/1987 | Tuckerman | 428/901 |
| 4,682,143 | 7/1987 | Chu et al. | 428/901 |
| 4,693,925 | 9/1987 | Cheung et al. | 428/901 |

Primary Examiner—Stephen J. Lechert, Jr.

[57] ABSTRACT

A radiation-hardened field oxide comprises a thin layer of high-quality thermal oxide, a thick layer of borophosphosilica glass and a diffusion barrier layer of undoped oxide, with the boron and phosphorous provising recombination sites for electron-hole pairs.

8 Claims, 1 Drawing Sheet

MULTI-LAYERED FIELD OXIDE STRUCTURE

TECHNICAL FIELD

The field of the invention is that of radiation hardened integrated circuits.

BACKGROUND ART

The field of radiation hardening in integrated circuits deals with the problem of electrons and holes generated by the passage of ionizing radiation through the circuit. Electron-hole pairs generated in the bulk silicon itself do not present a severe problem, as the electrons and holes recombine rapidly. Electron-hole pairs formed in silicon-dioxide Si-$O_2$ (referred to be the conventional term of "oxide"), however, are more difficult to deal with because the electrons are far more mobile than the holes and may become separated from the holes, making recombination more difficult.

The conventional process for making FET integrated circuits uses a field oxide between the active regions. Conventionally, the area that will be the field region is implanted either before or after the growth of the field oxide with an ion dose that is calculated to suppress the formation of parasitic transistors. The field oxide is conventionally grown by a wet thermal process, using a locos process or variations of it. With the field implant process, there is a dopant gradient extending down into the substrate, with a high concentration at the surface changing to the background bulk concentration at a depth of a micron or so. The nature of the bulk silicon underlying the circuit will depend on the nature of the process used for the circuit NMOS, PMOS or CMOS process.

DISCLOSURE OF THE INVENTION

The invention relates to a multi-layer field dielectric that comprises a thin undoped grown layer of high quality oxide in contact with the silicon substrate, above which is deposited a thick, heavily doped layer of oxide providing recombination sites for electron-hole pairs with the thick layer. The thin layer acts as a diffusion barrier preventing the diffusion of the dopant from the thick layer into the underlying substrate.

A feature of the invention is a third layer of undoped oxide deposited above the second thick layer. This top layer serves as an outgassing berrier to prevent the diffusion of the dopant from the thick layer into the active regions during subsequent processing steps.

BEST MODE OF CARRYING OUT THE INVENTION

Figure 1:
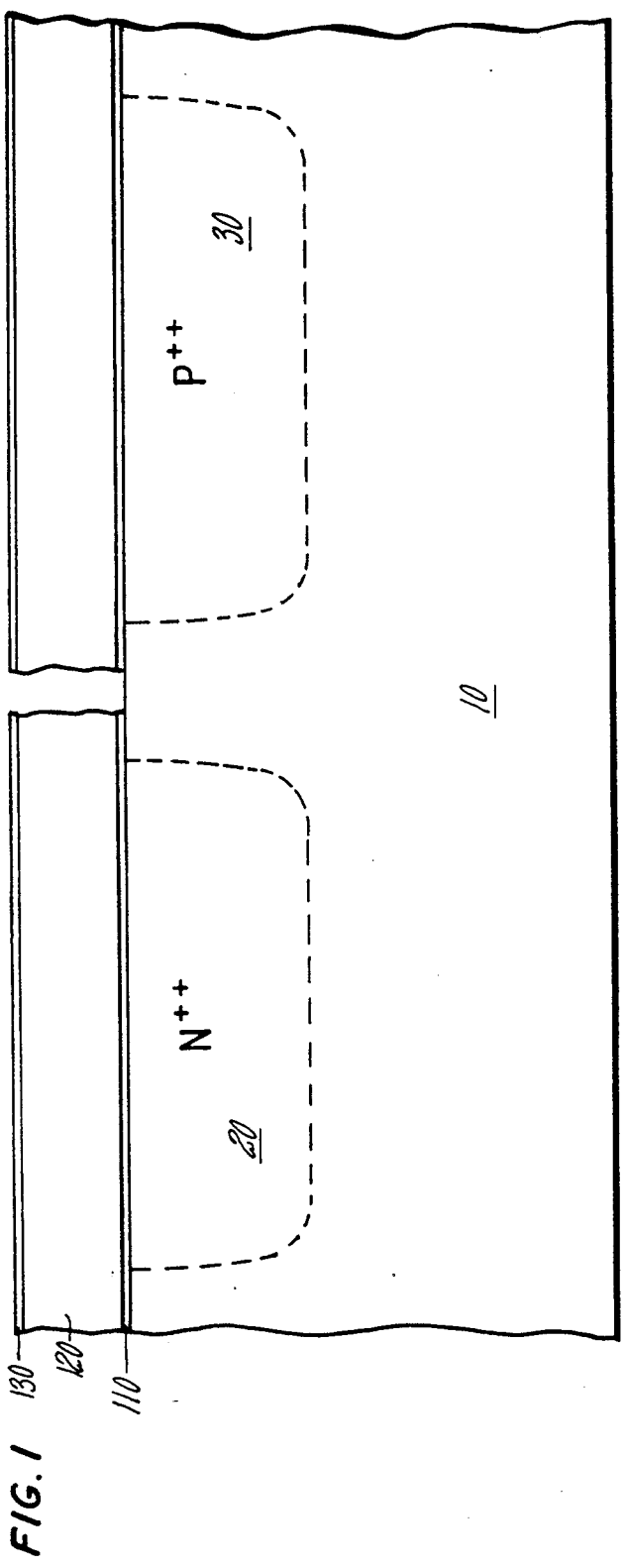
FIG. 1 illustrates, in cross-section, an area of a silicon wafer showing two tubs of opposite polarity having a multi-layer field oxide structure above them.

Referring now to FIG. 1, there is shown a silicon substrate 10 having an epitaxial layer within which two tubs 20 and 30 are formed. The tubs are N-doped and P-doped respectively. According to a preferred embodiment of the invention, the dopant concentration in the tubs is made sufficiently high so that the formation of parasitic channels at the silicon-oxide interface in the field region is effectively suppressed. In a CMOS process, a concentration of $2 \times 10^{17}/CM^3$ of Boron in the P-well may be used and $3.5 \times 10^{16}/CM^3$ of Phosphorous may be used in the N-well. The process of doping the substrate to suppress parasitic transistors will be referred to as preparing the substrate.

Above each tub and across the entire wafer there is first grown a thin, high quality oxide layer that is preferably grown in dry oxygen at temperatures between 900° C. and 1000° C., with 1000° C. preferred. The thickness of layer 110 may be about 150 Angstroms to 1500 Angstroms with 400 Angstroms preferred. This layer is a "high quality" layer as the term is conventially used in the field to indicate a layer having a relatively low stress and being substantially the same as the oxide layer grown as a gate oxide.

Above layer 110, there is deposited a relatively thick layer of oxide that contains at least one dopant species. This layer is deposited at a temperature of deposition from between 325° C. to 430° C. with a temperature of 420° C. preferred. The function of the dopant is to provide recombination sites to facilitate the recombination of electrons and holes. Many dopants conventional in silicon processing may be used, with boron and phosphorous being preferred. In the preferred embodiment, both boron and phosphorous are used together, as it has been found that the combination has an increased effectiveness over either constituent separately. Preferably, the oxide layer 120 is a borophosphosilica glass (BPSG), with the boron concentration by weight ranging from 1% to 4%, with 3% preferred, and the phosphorous concentration by weight ranging from 1% to 8%, with 5% preferred. The thickness of layer 120 may range from 1500 Angstroms to 8000 Anstroms, with 5000 Angstroms preferred.

An advantageous feature of the invention is that, while the phosphorous by itself would diffuse through layer 110 into the silicon over time, the presence of boron tends to prevent the phosphorous from migrating.

An additional feature of the invention is barrier layer 130. This is a relatively thin layer of deposited undoped oxide. The thickness may range from 250 Angstroms to 2000 Angstroms with 1000 Anstroms preferred. The deposition temperature may also range from 325° C. to 450° C., with 420° C. preferred. The function of layer 130 is to prevent the diffusion of the dopant from layer 120 out into the ambient and into the active regions during subsequent processing steps. If this happens, it disturbs the dopant balance, so that the thresholds of the transistors or other devices in the active region are not what they were designed to be. In ordinary processing, the first conductive layer would rest directly on the field oxide. In a device constructed according to this invention, intermediate layer 130 will be between layer 120 which makes up the main thickness of the field oxide and the first conductive layer. Oxide is a convenient material to use, but another material that would block diffusion, such as nitride or polycrystalline silicon might be used if it were preferred for some reason.

The multi-level field oxide is densified in oxygen at temperatures ranging from 400° C. to 1100° C., with 1000° C. preferred. The densification time ranges from 10 minutes to 60 minutes, with 30 minutes preferred.

Figure 2:
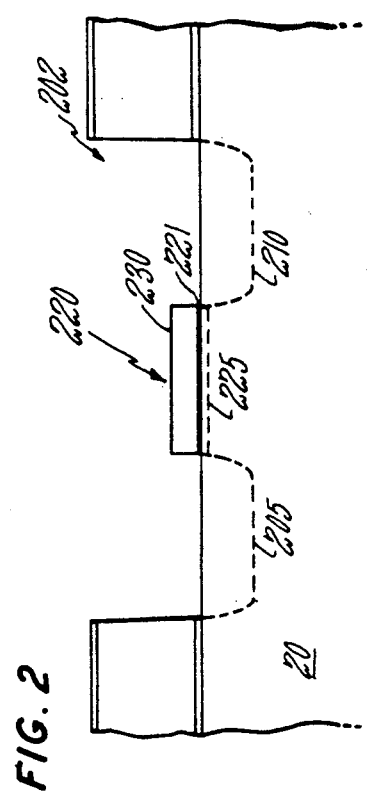
FIG. 2 illustrates, in cross-section, an active area formed within one of the tubs of the embodiment of FIG. 1.

Referring now to FIG. 2, there is shown in cross-section a portion of a wafer showing an aperture 202 that has been cut into the multi-layer field structure, preferably by a dry etch process. The region thus opened through aperture 202 is an active region and a transistor 220 having gate 230, gate oxide 221 and source and drain 205 and 210 respectively, is shown as being formed within the active area. Below gate 221 there is shown a region 225, which is implanted with a threshold implant in the conventional manner. The remainder of processing steps to form an integrated circuit after the completion of the multi-layer field oxide are conventional, well known to those skilled in the art.

Those skilled in the art will readily be able to devise further embodiments of the invention with the aid of this disclosure. For example, the dimensions and dopant concentrations may be varied from those illustrated here, as well as different dopant species that also serve to provide recombination sites.

As was stated above, the invention can be used with a variety of substrates, single-tub, twin tub, or a simple epitaxial layer. It also can be used with MOS or bipolar processes. For the purposes of this disclosure, the term across the wafer and similar terms will mean extending across a tub or a region of the substrate of one polarity, rather than literally across the entire wafer. It may be advisable for some reason to grow isolated tubs of one or the other polarity with a separation region between them. For example, there might be a Locos process used to define the tubs. The principles of the invention can be applied if the multi-layer field oxide structure is grown within the tub, not continuously over the entire wafer.

We claim:

1. A method of forming an integrated circuit on a silicon substrate having a surface, comprising the steps of:
    a) preparing predetermined field regions of said substrate with a predetermined dopant concentration;
    b) growing a first layer of undoped oxide by a dry thermal process in said predetermined field regions of said surface;
    c) depositing a second layer of doped oxide, having a predetermined concentration of at least one dopant, above said first layer;
    d) depositing a third barrier layer, capable of blocking the diffusion of said at least one dopant, above said second layer;
    e) etching a set of predetermined areas for active regions through said first, second and third layers down to said surface; and
    f) forming an integrated circuit on said substrate, having a plurality of interconnected components located in said set of predetermined areas for active regions.

2. A method according to claim 1, in which said at least one dopant comprises both boron and phosphorous.

3. A method according to claim 1, in which said barrier layer comprises undoped oxide.

4. A method according to claim 2, in which said barrier layer comprises undoped oxide.

5. A method according to claim 1, further including the step of densifying said first, second and barrier layers by heating to a temperature in the range between 400° C. to 1100° C. for a predetermined period of time.

6. A method according to claim 4, further including the step of densifying said first, second and barrier layers by heating to a temperature in the range between 400° C. to 1100° C. for a predetermined period of time.

7. A method according to claim 6, in which said first layer has a thickness of between 150 Angstroms and 1500 Angstroms; said second layer has a boron concentration of between 1% and 4% by weight, a phosphorous concentration of between 1% and 8% by weight and a thickness of between 1500 Angstroms and 8000 Angstroms; and said barrier layer has a thickness of between 250 Angstroms and 2000 Angstroms.

8. A method according to claim 7, in which said first layer is grown at a temperature of about 1000° C., said second layer is deposited at a temperature of about 400° C. and said barrier layer is deposited at a temperature of about 400° C.

* * * * *